(12) United States Patent
Xie et al.

(10) Patent No.: US 9,147,765 B2
(45) Date of Patent: Sep. 29, 2015

(54) FINFET SEMICONDUCTOR DEVICES WITH IMPROVED SOURCE/DRAIN RESISTANCE AND METHODS OF MAKING SAME

(75) Inventors: Ruilong Xie, Albany, NY (US); Mark Raymond, Schenectady, NY (US); Robert Miller, Yorktown Heights, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 780 days.

(21) Appl. No.: 13/354,024

(22) Filed: Jan. 19, 2012

(65) Prior Publication Data

US 2013/0187228 A1   Jul. 25, 2013

(51) Int. Cl.
*H01L 21/336* (2006.01)
*H01L 29/78* (2006.01)
*H01L 29/66* (2006.01)

(52) U.S. Cl.
CPC ........ *H01L 29/785* (2013.01); *H01L 29/66795* (2013.01); *H01L 29/66666* (2013.01)

(58) Field of Classification Search
CPC ............ H01L 29/785; H01L 29/66795; H01L 29/66666
USPC .......................... 438/268, 542; 257/327, 365
See application file for complete search history.

(56) References Cited

U.S. PATENT DOCUMENTS

| | | | |
|---|---|---|---|
| 7,282,766 B2 | 10/2007 | Okuno | |
| 7,425,500 B2 * | 9/2008 | Metz et al. | 438/607 |
| 7,692,254 B2 | 4/2010 | Anderson et al. | |
| 7,851,865 B2 | 12/2010 | Anderson et al. | |
| 7,915,693 B2 | 3/2011 | Okano | |
| 8,008,136 B2 | 8/2011 | Lin et al. | |
| 8,796,093 B1 * | 8/2014 | Cheng et al. | 438/268 |
| 2006/0157749 A1 * | 7/2006 | Okuno | 257/288 |
| 2008/0173942 A1 | 7/2008 | Zhu et al. | |
| 2009/0026505 A1 * | 1/2009 | Okano | 257/255 |
| 2010/0244103 A1 * | 9/2010 | Chan et al. | 257/213 |
| 2011/0001169 A1 | 1/2011 | Ozcan et al. | |
| 2011/0284967 A1 | 11/2011 | Cheng et al. | |
| 2013/0071980 A1 * | 3/2013 | Lin et al. | 438/300 |

* cited by examiner

*Primary Examiner* — Zandra Smith
*Assistant Examiner* — John M Parker
(74) *Attorney, Agent, or Firm* — Amerson Law Firm, PLLC

(57) ABSTRACT

Disclosed herein are various FinFET semiconductor devices with improved source/drain resistance and various methods of making such devices. One illustrative device disclosed herein includes a plurality of spaced-apart trenches in a semiconducting substrate, wherein the trenches at least partially define a fin for the device, an etch stop layer positioned above a bottom surface of each of the trenches, and a metal silicide region formed on all exposed surfaces of the fin that are positioned above an upper surface of the etch stop layer.

19 Claims, 9 Drawing Sheets

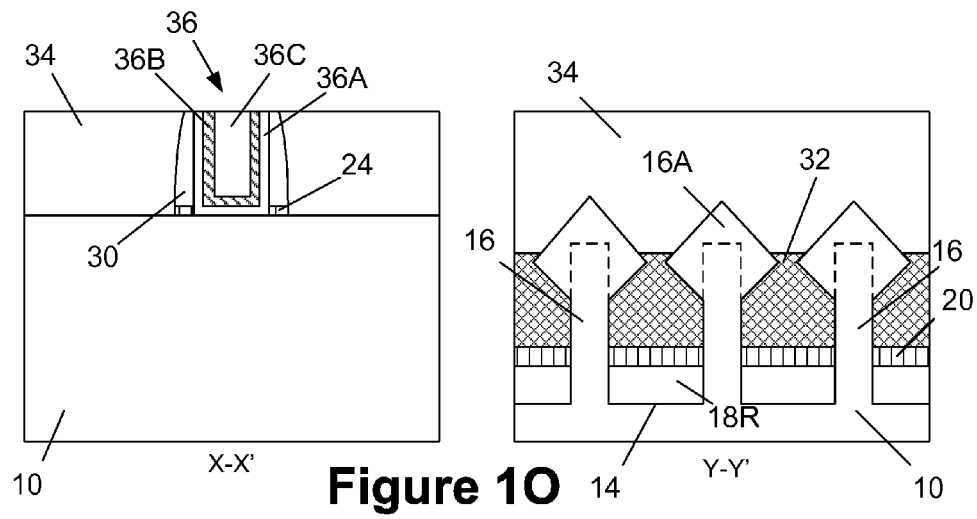
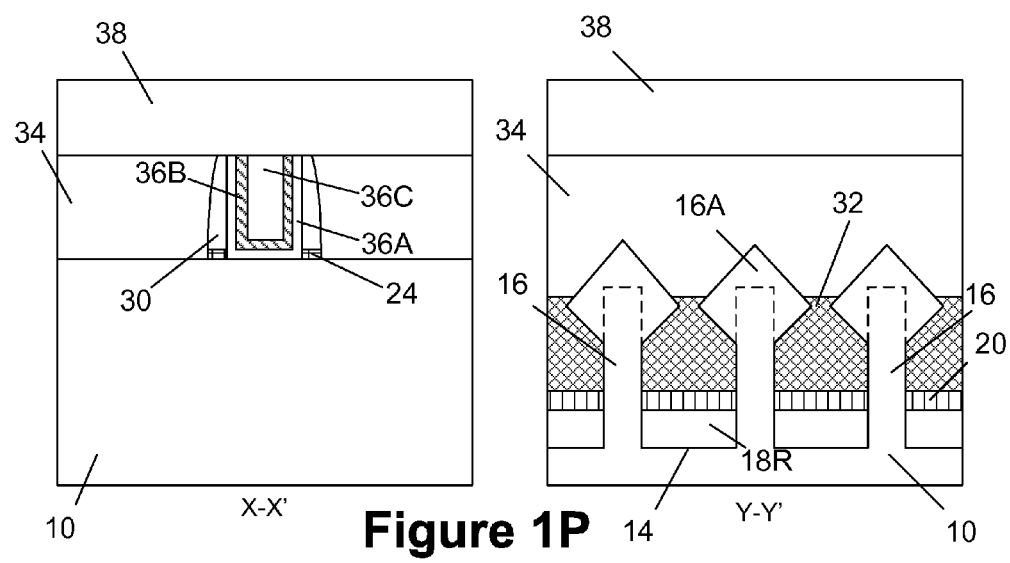

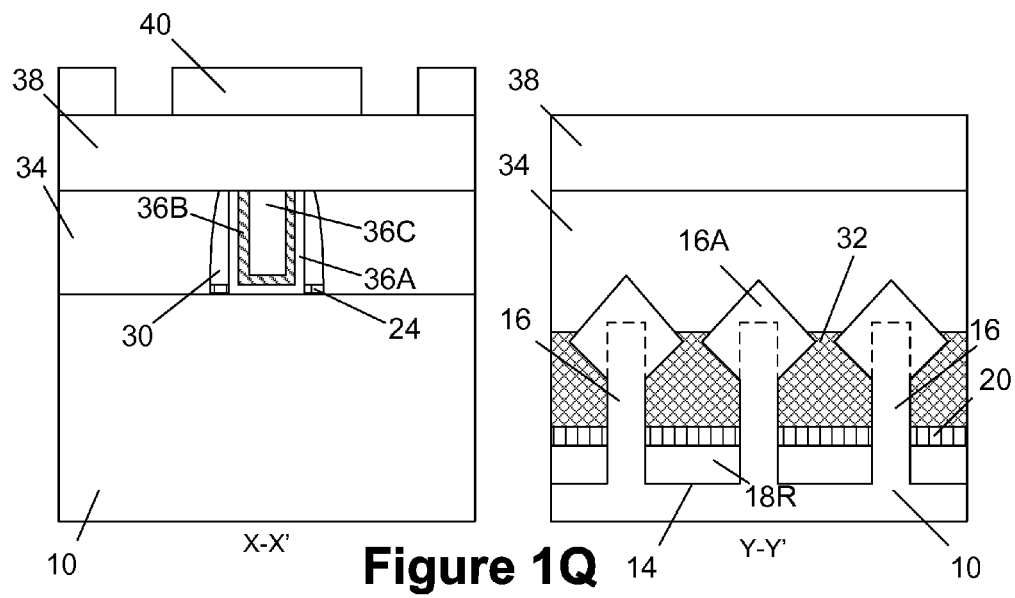
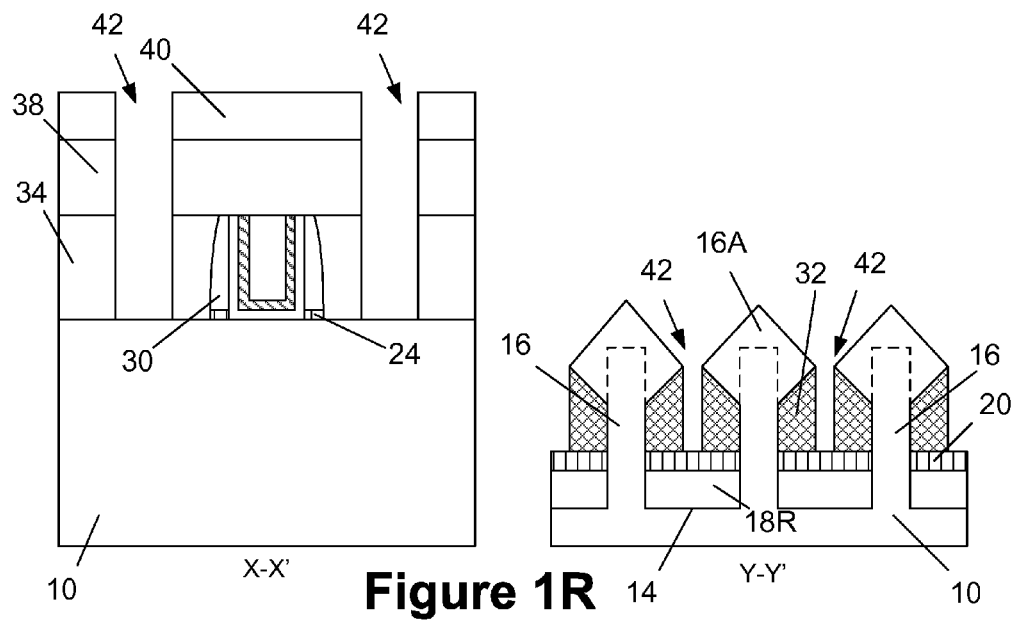

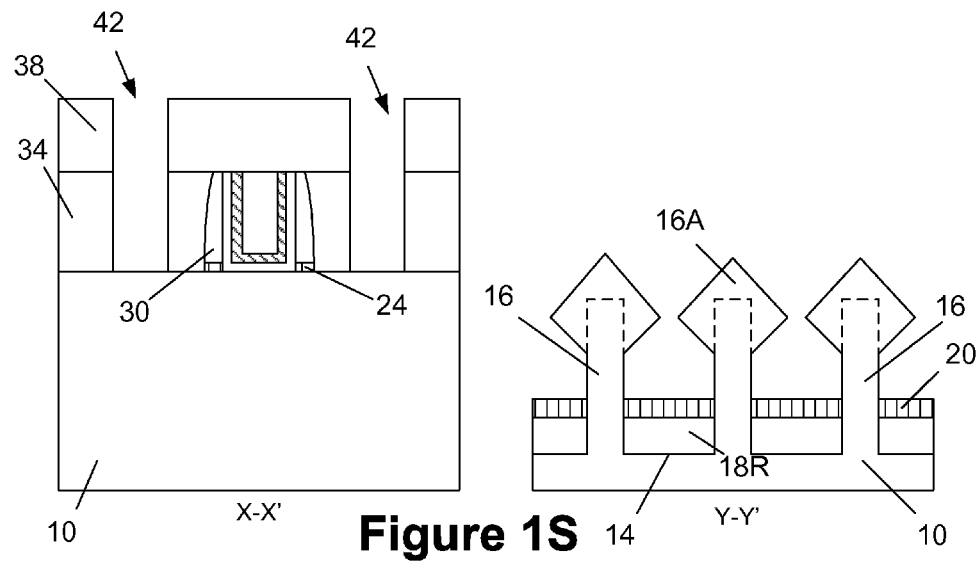
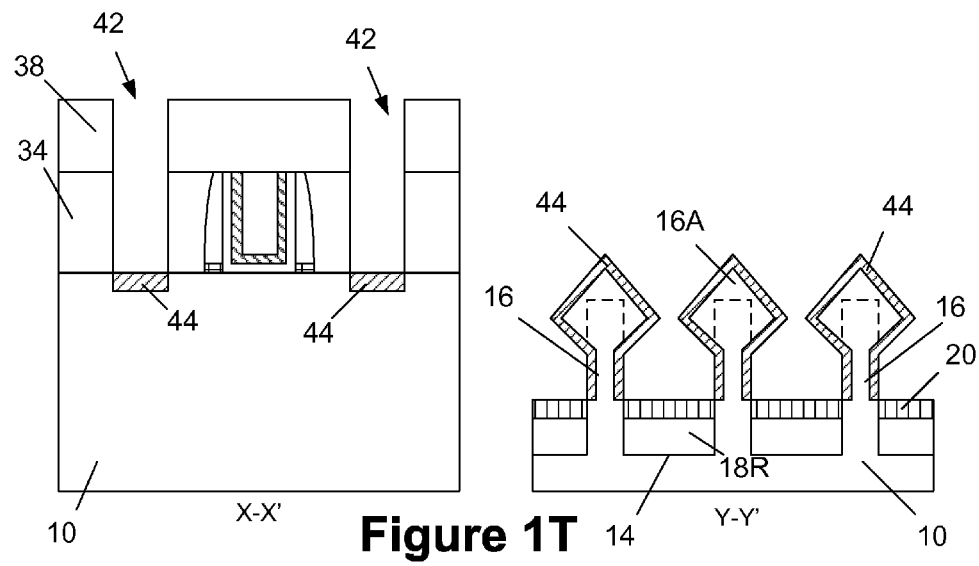

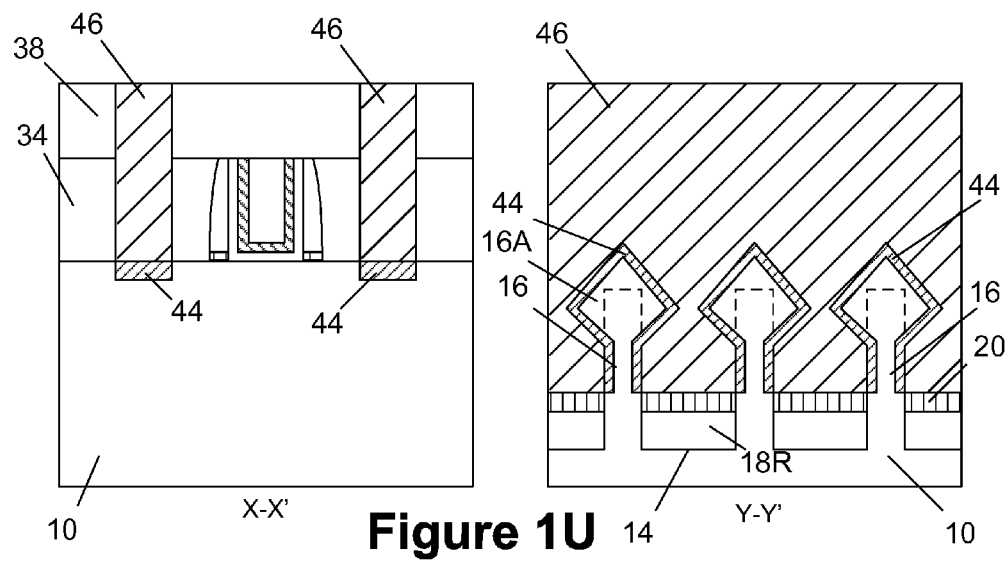

FINFET SEMICONDUCTOR DEVICES WITH IMPROVED SOURCE/DRAIN RESISTANCE AND METHODS OF MAKING SAME

BACKGROUND OF THE INVENTION

1. Field of the Invention

Generally, the present disclosure relates to the manufacturing of sophisticated semiconductor devices, and, more specifically, to various FinFET semiconductor devices with improved source/drain resistance and various methods of making such devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines the performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents which are relatively small). However, when an appropriate voltage is applied to the gate electrode, the channel region becomes conductive, and electrical current is permitted to flow between the source region and the drain region through the conductive channel region.

In contrast to a FET, which has a planar structure, there are so-called 3D devices (3-dimensional structures), such as an illustrative FinFET device. More specifically, in one illustrative embodiment of a FinFET, a generally vertically positioned fin-shaped active area is formed, and a gate electrode encloses both sides and an upper surface of the fin-shaped active area to form a tri-gate structure with a channel having a 3-dimensional structure instead of a planar structure. In some cases, an insulating cap layer, e.g., silicon nitride, is positioned at the top of the fin and the FinFET device may only have a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced relative to that of a planar FET device, which tends to reduce at least some short channel effects on a FinFET device.

Device designers are under constant pressure to increase the operating speed and electrical performance of transistors and integrated circuit products that employ such transistors. The gate length (the distance between the source and drain regions) on modern transistor devices may be approximately 30-50 nm, and further scaling or reduction of the gate length is anticipated in the future. Device designers have employed a variety of techniques, other than device scaling, in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NMOS transistors and create a compressive stress in the channel region for PMOS transistors), etc.

However, the ongoing shrinkage of feature sizes on transistor devices causes certain problems that may at least partially offset the advantages that may be obtained by performance increases associated with the scaling of device features. Generally, while decreasing the channel length of a transistor may lead to superior performance characteristics, such as higher drive current capabilities and enhanced switching speeds, the pitch between adjacent transistors likewise decreases, thereby limiting the size of the conductive contact elements—e.g., those elements that provide electrical connection to the transistor, such as contact vias and the like—that may fit within the available real estate between adjacent transistors. Accordingly, the electrical resistance of conductive contact elements becomes a significant issue in the overall transistor design, since the cross-sectional area of these elements is correspondingly decreased. Moreover, the cross-sectional area of the contact vias, together with the characteristics of the materials they comprise, may have a significant influence on the effective electrical resistance and overall performance of these circuit elements.

The use of so-called high-k/metal gate structures in replacement gate process flows to increase device electrical performance, while generally successful, has created some issues that need to be addressed. For example, after the deposition of a high-k insulating material, a post-deposition anneal is performed at a temperature that is typically greater than approximately 750° C. to insure adequate reliability of the gate stack materials. Metal silicide regions are typically formed on a transistor where contact is to be made to an underlying device, e.g., to the source/drain regions and/or the gate electrode, to reduce the contact resistance and hopefully improve the operating speed of the transistor. To the extent that metal silicide regions are formed prior to this post-deposition anneal process that is performed in a replacement gate process flow, the anneal process tends to cause the metal silicide regions to degrade, thereby increasing contact resistance and perhaps reducing the operating speed of the transistor.

The present disclosure is directed to various FinFET semiconductor devices with improved source/drain resistance and various methods of making such devices that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various FinFET semiconductor devices with improved source/drain resistance and various methods of making such devices. One illustrative device disclosed herein includes a plurality of spaced-apart trenches in a semiconducting substrate, wherein the trenches at least partially define a fin for the device, an etch stop layer positioned above a bottom surface of each of the trenches and a metal silicide region formed on all exposed surfaces of the fin that are positioned above an upper surface of the etch stop layer.

In another illustrative example, a device disclosed includes a plurality of spaced-apart trenches in a semiconducting substrate, wherein the trenches at least partially define a fin for the device, and wherein the fin comprises an epitaxially formed semiconductor material, a layer of insulating material positioned on a bottom surface of each of the trenches, an etch stop layer positioned on the layer of insulating material within each of the trenches and a metal silicide region formed on all exposed surfaces of the fin that are positioned above an upper surface of the etch stop layer.

In yet another illustrative example, a method disclosed herein includes forming a plurality of trenches in a semiconducting substrate that at least partially define a fin for the device, forming an etch stop layer above a bottom surface of each of the trenches, forming a sacrificial layer above the etch stop layer, after forming the sacrificial layer, forming a gate structure for the FinFET device and, after forming the gate structure, removing at least a portion of the sacrificial layer to expose at least a portion of the fin. This illustrative embodiment includes the additional steps of forming a semiconductor material on at least some of the exposed portion of the fin and forming a metal silicide region on at least some of the exposed surfaces of the fin and the semiconductor material that are positioned above an upper surface of the etch stop layer.

BRIEF DESCRIPTION OF THE DRAWINGS

The disclosure may be understood by reference to the following description taken in conjunction with the accompanying drawings, in which like reference numerals identify like elements, and in which.

Figure 1A:
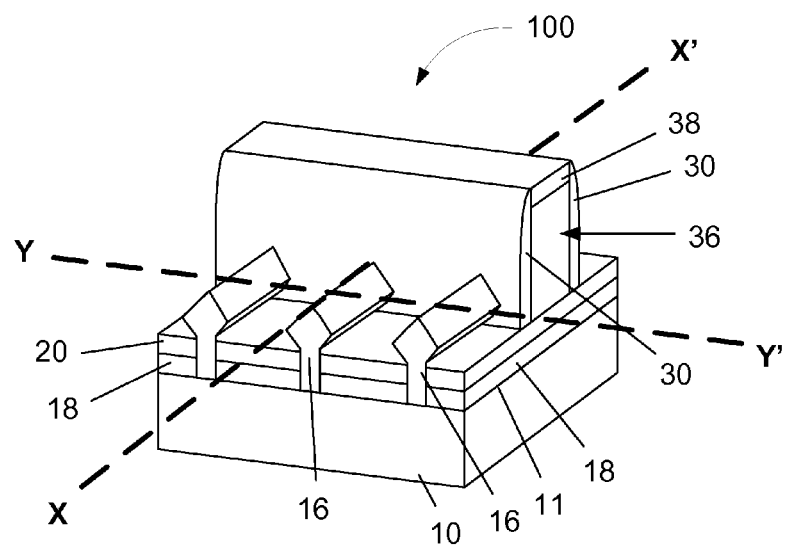
FIGS. 1A-1U depict various illustrative embodiments of a FinFET device disclosed herein having an improved source/drain resistance and one illustrative method of making such devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various FinFET semiconductor devices with improved source/drain resistance and various methods of making such devices. As will be readily apparent to those skilled in the art upon a complete reading of the present application, the present method is applicable to a variety of devices, including, but not limited to, logic devices, memory devices, etc. With reference to the attached drawings, various illustrative embodiments of the methods and devices disclosed herein will now be described in more detail.

Figure 1B:
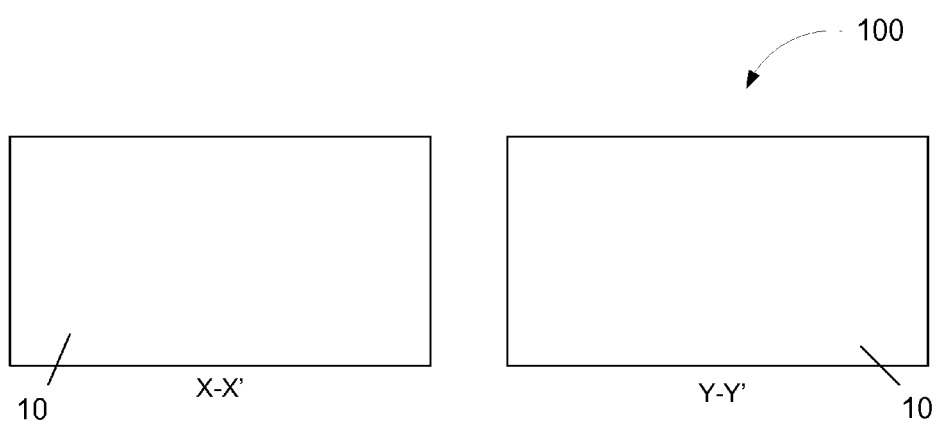

FIG. 1A is a simplified view of an illustrative, partially-manufactured FinFET semiconductor device 100. The device 100 is formed above a semiconducting substrate 10 having an upper surface 11. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon. In one illustrative embodiment, the device 100 includes a plurality of fins 16, an optional layer of insulating material 18, an etch stop layer 20, an illustrative gate structure 36, sidewall spacers 30 and a gate capping layer 38. The two depicted axis ("X-X'" and Y-Y'") reflect where various cross-sectional views in FIGS. 1B-1T are taken. Of course, as will be recognized by those skilled in the art after a complete reading of the present application, the FinFET device 100 depicted herein is but one example of a variety of differently configured FinFET devices that may employ one or more aspects of the inventions disclosed herein. Thus, the inventions claimed herein should not be considered as limited to the particular examples described and depicted herein.

In FIGS. 1B-1U, the cross-sectional view along the X-X' axis is on the left side of the drawing while the cross-sectional view along the Y-Y' axis is on the right side of the drawing. As shown in FIG. 1B, one illustrative process flow described herein begins with the bare substrate 10. It should be noted that any isolation structure that would typically be formed in the substrate 10 to electrically isolate the device 100 is not depicted in the attached drawings.

Figure 1C:
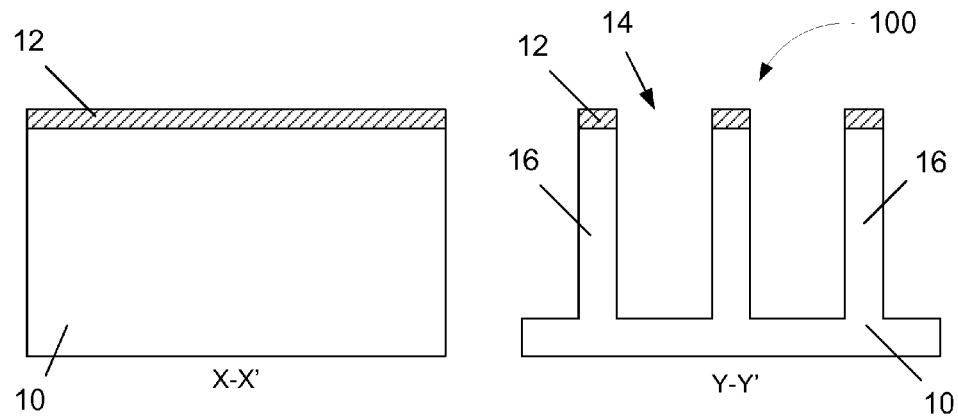

As shown in FIG. 1C, a patterned mask layer 12, such as a patterned hard mask layer, has been formed above the substrate 10 using known photolithography and etching techniques. The patterned mask layer 12 is intended to be representative in nature as it could be comprised of a variety of materials, such as, for example, a photoresist material, silicon nitride, silicon oxynitride, silicon dioxide, etc. Moreover, the patterned mask layer 12 could be comprised of multiple layers of material such as, for example, a pad oxide layer (not shown) that is formed on the substrate 10 and a silicon nitride layer (not shown) that is formed on the pad oxide layer. Thus, the particular form and composition of the patterned mask layer 12, and the manner in which it is made should not be considered a limitation of the present invention. In the case where the patterned mask layer 12 is comprised of one or more hard mask layers, such layers may be formed by performing a variety of known processing techniques such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 12 is a hard mask layer of silicon nitride having a thickness of about 5-50 nm that is initially formed by performing a CVD process and thereafter patterned using known sidewall image transfer techniques and/or photolithographic techniques combined with performing known etching techniques.

With continuing reference to FIG. 1C, an etching process, such as a dry or wet etching process, is performed on the substrate 10 through the patterned mask layer 12 to form a plurality of trenches 14 in the substrate 10. This etching process results in the definition of a plurality of fins 16. The overall size, shape and configuration of the trenches 14 and fins 16 may vary depending on the particular application. The depth and width of the trenches 14 may vary depending upon the particular application. In the example of the device 100 depicted in FIGS. 1A-1T, the trenches 14 and fins 16 are all of a uniform size and shape. However, such uniformity in the size and shape of the trenches 14 and the fins 16 is not required to practice at least some aspects of the inventions disclosed herein. In the example depicted in FIG. 1C, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. Thus, the size and configuration of the trenches 14, and the manner in which they are made, should not be considered a limitation of the present invention.

Figure 1D:
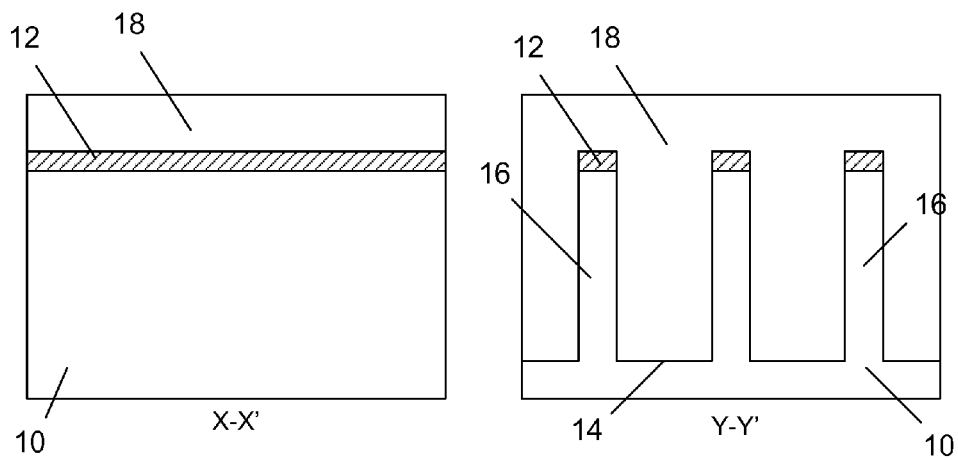

Then, as shown in FIG. 1D, in some applications, a layer of insulating material 18 may be blanket-deposited across the device 100 so as to overfill the trenches 14 by performing a CVD process. As noted previously, the layer of insulating material 18 is optional and may not be required in all applications. The layer of insulating material 18 may be comprised of a variety of different materials, such as, for example, silicon dioxide or other dielectric materials, such as carbon-doped silicon dioxide or boron-doped silicon dioxide, etc.

Figure 1E:
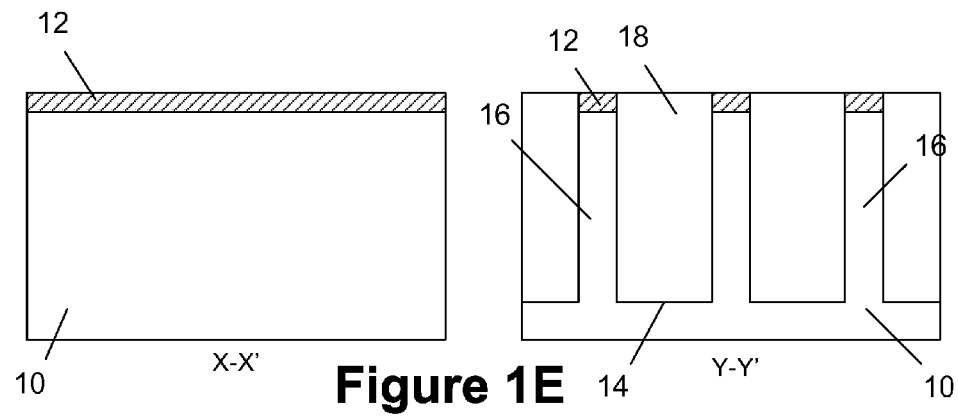

Next, as shown in FIG. 1E, a chemical mechanical polishing (CMP) process is performed that stops on the patterned hard mask layer 12. The purpose of the CMP process is to planarize the surface of the layer of insulating material 18 and to clear the layer of insulating material 18 from above the patterned hard mask layer 12.

Figure 1F:
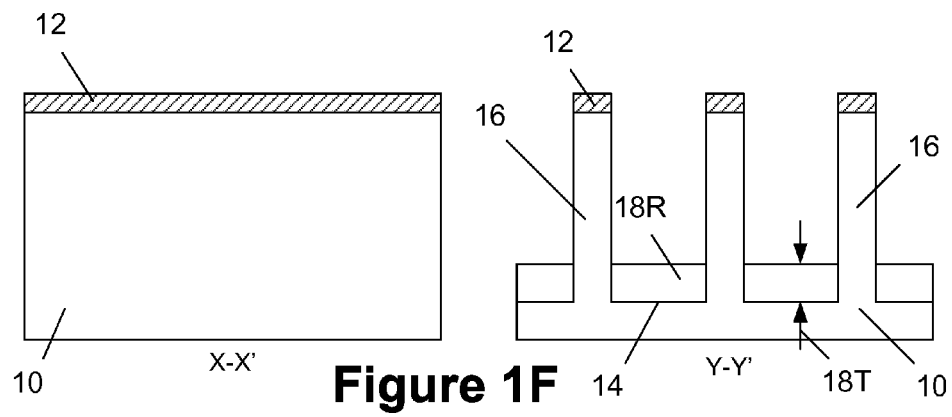
Figure 1G:
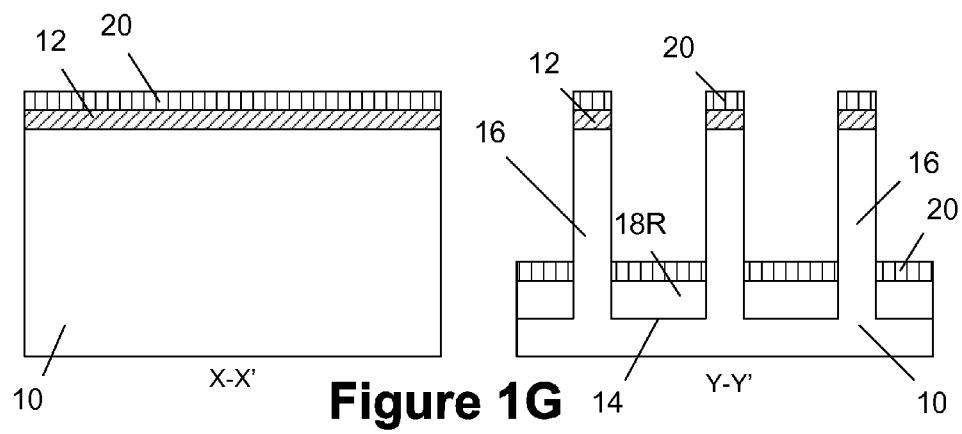

Then, as shown in FIG. 1F, one or more etching processes are performed on the layer of insulating material 18 to reduce its overall thickness and thereby define a reduced thickness layer of insulating material 18R. The etching process may be either a wet or dry etching process. The final thickness 18T of the reduced thickness layer of insulating material 18R may vary depending upon the particular application. In one illustrative embodiment, the final thickness 18T of the reduced thickness layer of insulating material 18R may be about 10-70 nm.

Next, as shown in FIG. 1 G, a gas cluster ion beam (GCIB) process is performed to form an etch stop layer 20 on the exposed horizontal surfaces of the device 100. More specifically, the process results in the formation of the etch stop layer 20 within the trench 14 on top of the layer of insulating material 18R and above the patterned hard mask layer 12. The GCIB process may be performed with (a masked process) or without (a blanket process) a masking layer, e.g., a photoresist mask or a hard mask. However, so as not to obscure the present invention, such a masking layer is not depicted in the drawings. The etch stop layer 20 may be comprised of a variety of materials, e.g., silicon nitride, and its thickness may vary depending upon the particular application. In one illustrative embodiment, the etch stop layer 20 is a layer of silicon nitride having a thickness of about 5-20 nm. As noted previously, the layer of insulating material 18 may not be employed in all applications. In the cases where the layer of insulating material 18 is not present, the etch stop layer 20 may be formed on the exposed portions of the substrate 10 at the bottom of the trenches 14.

Figure 1H:
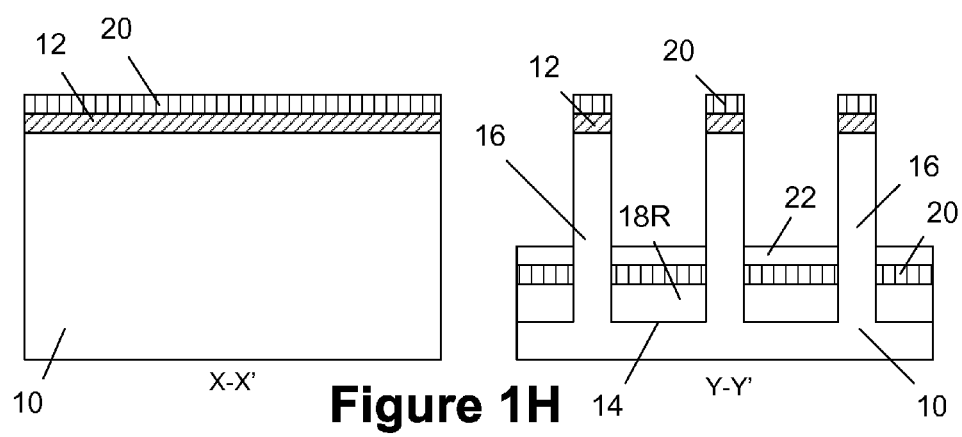
Figure 1I:
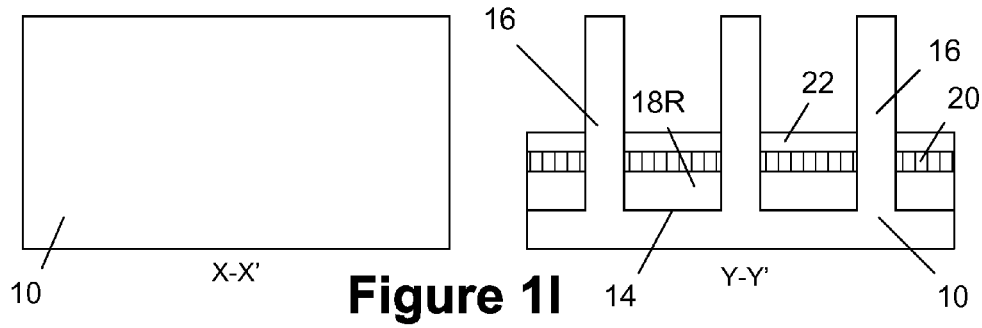

Then, as shown in FIG. 1H, a layer of insulating material 22 may be formed above the etch stop layer 20. The layer of insulating material 22 may be formed by performing the same blanket-deposition, CMP, etch-back process described above in FIGS. 1D-1F for the layer of insulating material 18. The layer of insulating material 22 may be comprised of a variety of different materials, such as, for example, silicon dioxide or other dielectric materials, such as carbon-doped silicon dioxide or boron-doped silicon dioxide, etc., and its thickness may vary depending upon the particular application. As shown in FIG. 1I, after the layer of insulating material 22 is formed, the exposed portions of the etch stop layer 20 and the patterned hard mask layer 12 may be removed. In one example, these materials may be removed by performing a wet etching process using an etchant such as, for example, hot phosphoric acid.

Figure 1J:
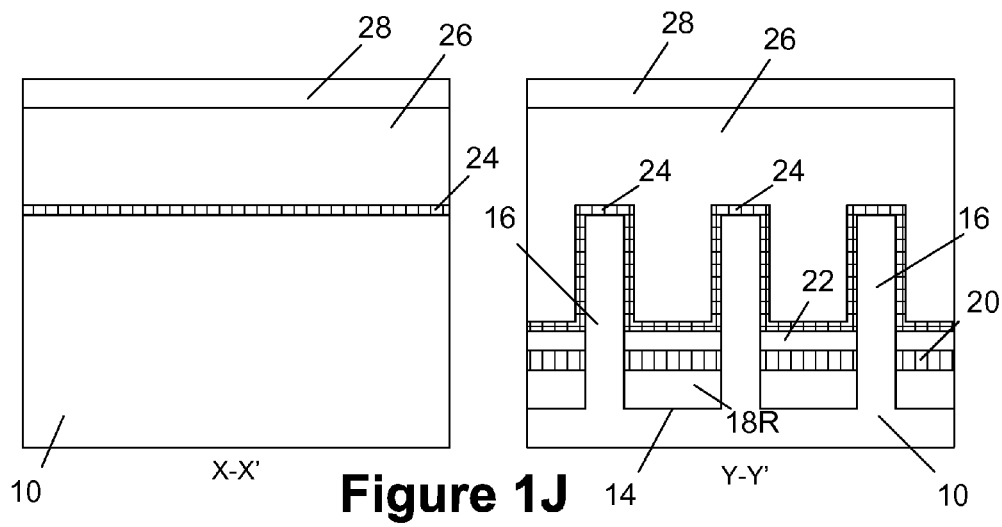
Figure 1K:
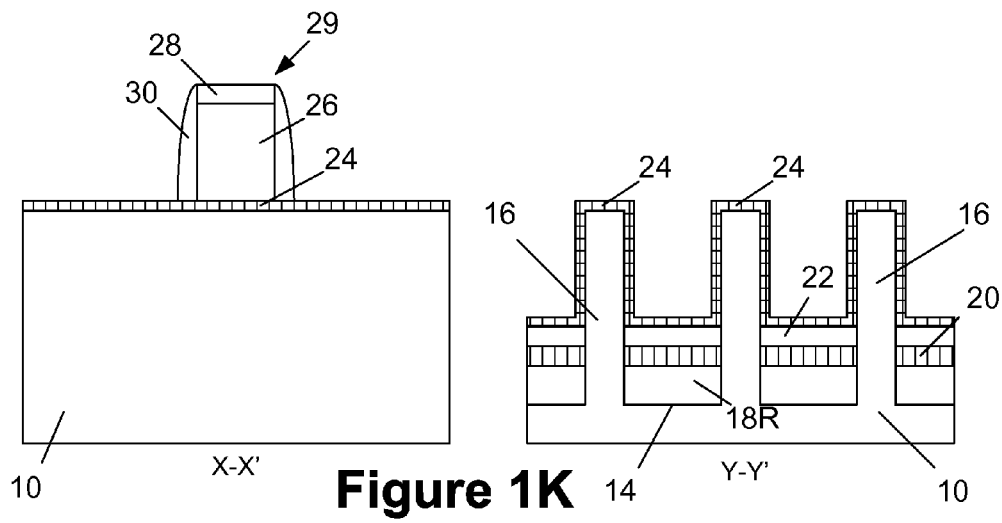

FIGS. 1J-1K depicts the device 100 after several process operations have been performed to create a gate structure for the device 100. As will be recognized by those skilled in the art after a complete reading of the present application, the gate structure of the device 100, i.e., the gate insulation layer and the gate electrode, may be comprised of a variety of different materials and it may have a variety of configurations, and the gate structure may be made using either so-called "gate-first" or "gate-last" techniques. In the illustrative example depicted in FIGS. 1A-1U, the gate structure 36 (see FIG. 1O) for the device 100 is formed using a so-called gate-last or replacement gate technique. Thus, FIGS. 1J-1K depict the formation of a dummy gate structure 29 comprised of an illustrative dummy or sacrificial gate insulation layer 24 and an illustrative dummy or sacrificial gate electrode 26 formed thereabove. An illustrative gate cap layer 28 is also formed above the dummy gate electrode layer 26. The dummy gate insulation layer 24 may be comprised of a variety of different materials, such as, for example, silicon dioxide, and the dummy gate electrode 26 may also be of a material such as polysilicon or amorphous silicon. The gate cap layer 28 may be made of a variety of materials such as, for example, silicon nitride. The dummy gate insulation layer 24, dummy gate electrode 26 and the gate cap layer 28 may be formed by depositing the appropriate materials and then patterning those layers of material using known photolithographic and etching techniques. As shown in FIG. 1K, sidewall spacers 30 comprised of, for example, silicon nitride, are formed adjacent the gate electrode 26. The spacers 30 may be formed by depositing a layer of spacer material and thereafter performing an anisotropic etching process.

Figure 1L:
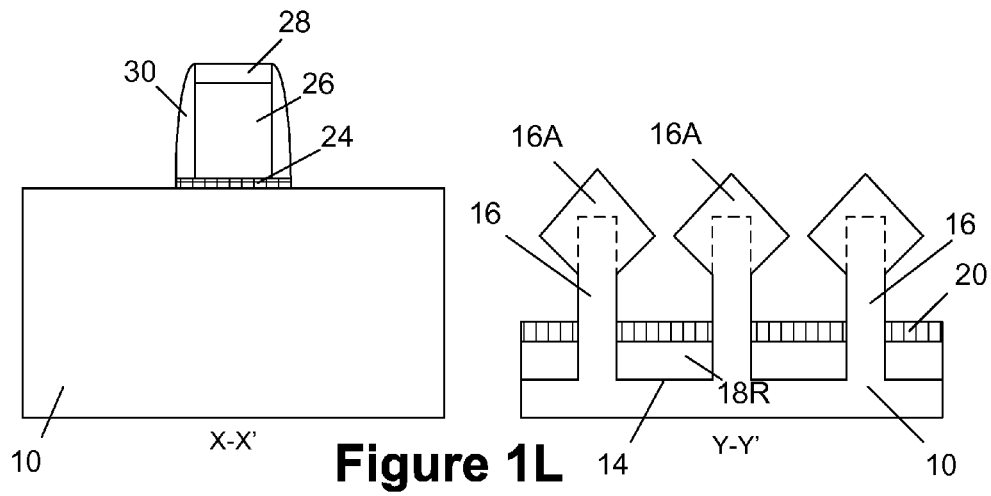

Next, as shown in FIG. 1L, the device 100 is subjected to a cleaning process in advance of performing an epitaxial deposition process to remove any native oxide material. This cleaning process may be performed using a variety of etchants or cleaning agents, such as a dilute HF acid. During this cleaning process, the etch stop layer 20 serves to protect the underlying layer of insulating material 18R, when present, or the underlying substrate 10 when the layer of insulating material 18R is not employed. The cleaning process removes the exposed portions of the dummy gate insulation layer 24 and the layer of insulating material 22 from within the trenches 14. FIG. 1L also depicts the device 100 after an epitaxial deposition process has been performed to grow epitaxial semiconductor material 16A on the fins 16. For explanation purposes, the original shape of the fins 16 is depicted in dashed lines in FIG. 1L and subsequent drawings. In one illustrative embodiment, the epitaxial semiconductor material 16A may have a substantially diamond-shaped configuration as depicted in the drawings. Of course, the inventions disclosed herein should not be considered as limited to any particular shape of the epitaxial semiconductor material 16A. In other applications, the formation of the epitaxial semiconductor material 16A may not be required.

Figure 1M:
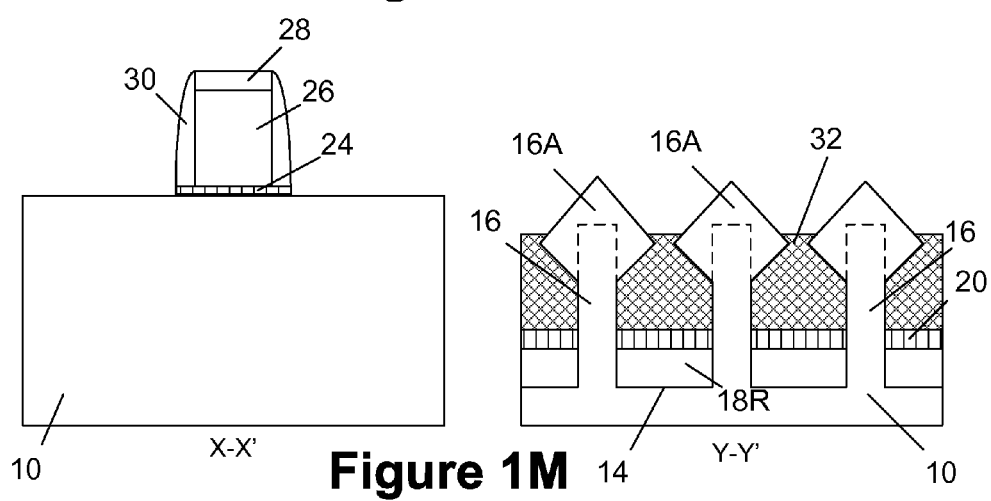

Next, as shown in FIG. 1M, a layer of insulating material 32, such as a flowable oxide material, is formed in the trenches 14 above the etch stop layer 20, using traditional techniques. For example, in the case where the layer of insulating material is a flowable oxide material, the layer of flowable oxide may be readily removed during a subsequent wet etching process using, for example, diluted HF acid. In one illustrative embodiment, the layer of insulating material 32 may have a thickness of about 10-20 nm, depending upon the particular application.

Figure 1N:
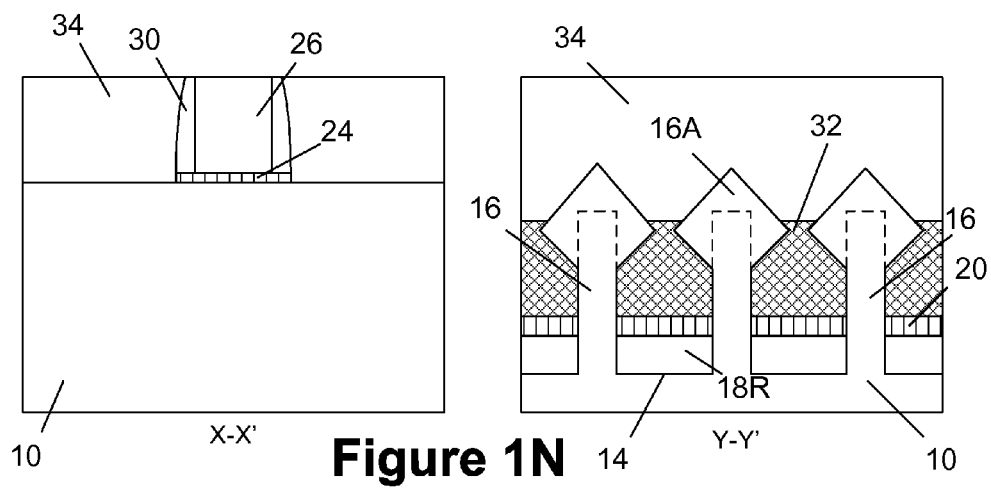

FIG. 1N depicts the device 100 after various process operations have been performed on the device 100. First, an inter-dielectric layer of insulating material 34 is blanket-deposited across the device 100 so as to overfill the trenches 14 by performing a CVD process. The layer of insulating material 34 may be comprised of a variety of different materials, such as, for example, silicon dioxide, a so-called high-k (k greater than 5) insulation material (where k is the relative dielectric constant). Thereafter, a CMP process is performed to remove the gate cap layer 28 and thereby expose the gate electrode 26 to further processing.

FIG. 1O depicts the device 100 after an illustrative replacement gate structure 36 has been formed for the device 100. The replacement gate structure 36 is intended to be representative in nature of any type of replacement gate structure that may be employed on any type of semiconductor device. In one illustrative embodiment, the replacement gate structure is comprised of a gate insulation layer 36A, a work-function adjusting metal layer 36B and another metal layer 36C. The materials of construction for the replacement gate structure 36 may vary depending on the particular application. For example, the gate insulation layer 36A may be comprised of a so-called high-k material—i.e., a material having a dielectric constant, or k-value, of approximately 10 or greater— such as tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Similarly, the work-function adjusting metal layer 36B may be comprised of, for example, titanium (Ti), titanium nitride (TiN), titanium-aluminum (TiAl), tantalum (Ta), tantalum nitride (TaN), tantalum carbide (TaC), tantalum carbonitride (TaCN), tantalum silicon nitride (TaSiN), tantalum silicide (TaSi) and the like. The layer 36C may be comprised of a variety of materials, such as aluminum, tungsten, etc. The replacement gate structure 36 is typically formed by performing one or more etching processes to remove the dummy gate electrode 26 and the dummy gate insulation layer 24 to thereby define a gate cavity (not shown) between the sidewall spacers 30. Thereafter, the various layers of material that will constitute the replacement gate structure 36 are formed in the gate opening and a CMP process is performed to remove excess portions of the gate insulation layer 36A, the work-function adjusting layer 36B and the metal layer 36C positioned outside of the gate opening to define the replacement gate structure 36.

In FIG. 1P, a gate capping layer 38, such as, for example, silicon nitride, is formed above the device 100 to encapsulate the replacement gate structure 36 so as to protect it from subsequent processing operations. The gate capping layer 38 may be formed to any desired thickness and it may be formed by performing a variety of known processes, such as a CVD process.

Next, as shown in FIGS. 1Q-1R, a patterned masking layer 40, such as a patterned photoresist mask, is formed above portions of the device 100 using known photolithographic tools and techniques. Thereafter, an etching process, such as an anisotropic reactive ion etching process, is performed to define a plurality of contact openings 42. In this illustrative embodiment, the contact openings 42 define line-type features that extend essentially parallel to the Y-Y' axis shown in FIG. 1A. In the depicted embodiment, the openings 42 extend downward and stop on the etch stop layer 20. Of course, the size, shape and configuration of the openings 42 may vary depending upon the particular application. Note that, since the openings 42 are, in this illustrative example, defined be performing an anisotropic etching process, portions of the layer of insulating material 32 shielded by the epitaxial semiconductor material 16A may not be completely removed at this point in the process.

Next, as shown in FIG. 1S, the patterned mask layer 40 has been removed and a pre-silicide cleaning process has been performed. This results in the removal of any native oxide material around the fins 16 and in the removal of any residual portions of the layer of insulating material 32. Note that the etch stop layer 20 serves to protect the underlying layer of insulating material 18R, when present, or the underlying substrate 10 when the layer of insulating material 18R is not employed.

Next, as shown in FIG. 1T, a silicidation process is performed to form metal silicide regions 44 on all of the exposed surfaces of the fin 16 that are positioned above the etch stop layer 20. The etch stop layer 20 prevents the formation of metal silicide material between the fins 16 thereby reducing the chances for undesirable shorts while allowing full and effective silicidation of the fins 16 (including the semiconductor material 16A when present). The metal silicide regions 44 may be comprised of a variety of different materials such as, for example, nickel silicide, nickel-platinum silicide, cobalt silicide, etc., and the thickness of such metal silicide regions may vary depending upon the particular application. The typical steps performed to form the metal silicide regions 44 involve: (1) depositing a layer of refractory metal wherein, in one illustrative example, a CVD type of metal deposition process may be performed to enable silicide coverage underneath the epitaxial semiconductor material 16A; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art.

Next, as shown in FIG. 1U, a plurality of conductive contact structures 46 are formed on the device 100. The conductive contact structures 46 may be formed by overfilling the contact openings 42 and thereafter performing a CMP process to remove excess material positioned outside of the openings 42. One or more barrier layers (not shown) may be formed in the openings 42 prior to filling the openings with a conductive material. The conductive contact structures 46 may be comprised of a variety of materials, such as copper, aluminum, tungsten, etc. In some cases, the processes disclosed herein may result in some voids being present in the regions underneath the epitaxial semiconductor material 16A, but the presence of such voids is not believed to be detrimental to the operation of the device disclosed herein given the relatively large amount of contact between the conductive structure 46 and the relatively large regions of metal silicide 44 that may be formed on the device disclosed herein.

In the illustrative example where a "gate-first" approach is performed to form the gate structure for the device 100, a slightly different process flow may be employed if desired. For example, instead of using the dummy gate insulation layer 24 and the dummy gate electrode 26, those materials would not be sacrificial in nature. Rather, in a gate-first approach, the gate insulation layer 24 and the gate electrode 26 would be the final such structures for the device 100. Of course, the materials used for the gate insulation layer 24 and the gate electrode 26 in a "gate-first" application might be different as well. For example, the gate insulation layer 24 may be comprised of a high-k insulation material and the gate electrode 26 may be comprised of one or more layers of metal. In one illustrative process flow for a "gate-first" application, the steps employed may be substantially the same as those employed in FIGS. 1B-1L. For a gate-first approach, the metal silicide regions 44 (shown in FIG. 1T) may be formed prior to forming the layer of insulating material 32 depicted in FIG. 1M and the layer of insulating material 34 depicted in FIG. 1N. Thereafter, the process flow for the "gate-first" approach would be the same as those depicted in FIGS. 1P-1R and 1U as it relates to the formation of various layers of insulating material and the formation of the conductive structures 46 shown in FIG. 1U.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a plurality of trenches in a semiconducting substrate that at least partially define a fin for said FinFET device;
   forming an etch stop layer above a bottom surface of each of said trenches;
   forming a sacrificial layer above said etch stop layer;
   after forming said sacrificial layer, forming a gate structure for said FinFET device,
      wherein forming said gate structure comprises forming a layer of gate insulation material over said fin and above said sacrificial layer and forming a layer of gate electrode material above said layer of gate insulation material;
   after forming said gate structure, removing at least a portion of said sacrificial layer to expose at least a portion of said fin;
   forming a semiconductor material on at least some of said exposed portion of said fin; and
   forming a metal silicide region on at least some of said exposed surfaces of said fin and said semiconductor material that are positioned above an upper surface of said etch stop layer.

2. The method of claim 1, wherein forming said etch stop layer above said bottom surface of each of said trenches comprises forming said etch stop layer on said bottom surface of each of said trenches.

3. The method of claim 1, wherein forming said semiconductor material comprises performing an epitaxial deposition process to form said semiconductor material.

4. The method of claim 1, wherein at least a portion of a perimeter of said semiconductor material has a substantially diamond-shaped configuration.

5. The method of claim 1, further comprising forming a conductive contact structure that is positioned above said etch stop layer and conductively coupled to said fin.

6. The method of claim 1, further comprising forming a layer of flowable oxide under at least a portion of said semiconductor material and above said etch stop layer prior to forming said metal silicide region.

7. The method of claim 6, further comprising, prior to forming said metal silicide regions, performing an etching process to remove said flowable oxide material.

8. The method of claim 1, further comprising, prior to forming said metal silicide region:
   forming a layer of insulating material above at least said semiconductor material; and
   forming an opening in said layer of insulating material to thereby expose at least a portion of said semiconductor material.

9. The method of claim 1, wherein the step of forming said metal silicide region on at least some of said exposed surfaces of said fin and said semiconductor material comprises forming said metal silicide region on all exposed surfaces of said fin and said semiconductor material.

10. The method of claim 1, further comprising, prior to forming said etch stop layer, forming a layer of insulating material in each of said plurality of trenches, wherein said layer of insulating material is formed so as to expose upper sidewall surfaces of said fin and said etch stop layer is formed above an upper surface of said layer of insulating material.

11. The method of claim 1, wherein forming said etch stop layer comprises performing a deposition process to selectively deposit said etch stop layer above horizontal surfaces of said plurality of trenches and said fin, and wherein said sacrificial layer is formed above an as-deposited upper surface of said etch stop layer.

12. The method of claim 11, wherein performing said deposition process comprises performing a gas cluster ion beam deposition process.

13. The method of claim 1, wherein removing said at least said portion of said sacrificial layer to expose said at least said portion of said fin comprises removing exposed portions of said layer of gate insulation material from above said sacrificial layer.

14. A method of forming a FinFET device, comprising:
   forming a plurality of trenches in a semiconducting substrate, said plurality of trenches at least partially defining a fin for said FinFET device;
   forming a first layer of insulating material above a bottom surface of each of said plurality of trenches, said first layer of insulating material exposing at least upper sidewall surface portions of said fin;

forming an etch stop layer in each of said plurality of trenches, said etch stop layer covering an upper surface of said first layer of insulating material and exposing at least said upper sidewall surface portions of said fin;

forming a second layer of insulating material in each of said plurality of trenches, said second layer of insulating material covering an upper surface of said etch stop layer and exposing at least said upper sidewall surface portions of said fin;

after forming said second layer of insulating material, forming a gate structure for said FinFET device, said gate structure comprising a gate insulation layer and a gate electrode layer formed above said gate insulation layer;

after forming said gate structure, removing at least a portion of said second layer of insulating material to expose a lower sidewall portion of said fin;

forming a semiconductor material on at least some exposed surface portions of said fin; and forming a metal silicide region on at least some exposed surfaces of said fin and said semiconductor material that are positioned above an upper surface of said etch stop layer.

15. The method of claim 14, wherein forming said etch stop layer comprises performing a gas cluster ion beam deposition process to selectively deposit said etch stop layer on exposed horizontal surfaces of said device.

16. The method of claim 14, further comprising, prior to forming said metal silicide region, forming a third layer of insulating material above said etch stop layer so as to cover a lower portion of said semiconductor material and forming a fourth layer of insulating material above said third layer of insulating material so as to cover an upper portion of said semiconductor material.

17. A method of forming a FinFET device, comprising:

forming a plurality of trenches in a semiconducting substrate that at least partially define a fin for said FinFET device;

forming a layer of insulating material in each of said plurality of trenches;

depositing an etch stop layer above said layer of insulating material formed in each of said plurality of trenches, wherein a height level of an as-deposited upper surface of said etch stop layer is lower than a height level of a top surface of said fin;

forming a sacrificial material layer in each of said plurality of trenches, said sacrificial material layer covering said upper surface of said etch stop layer and exposing an upper sidewall surface portion of said fin;

after forming said sacrificial layer, forming a gate structure for said FinFET device over said fin;

after forming said gate structure, removing at least a portion of said sacrificial material layer to expose a lower sidewall surface portion of said fin;

forming a semiconductor material on at least some exposed surfaces of said fin; and forming a metal silicide region on at least some exposed surfaces of said fin and said semiconductor material that are positioned above said upper surface of said etch stop layer.

18. The method of claim 17, wherein depositing said etch stop layer comprises performing a gas cluster ion beam deposition process to selectively deposit said etch stop layer on exposed horizontal surfaces of said device.

19. The method of claim 17, further comprising, prior to forming said metal silicide region, forming a layer of insulating material above at least said semiconductor material and forming an opening in said layer of insulating material, said opening exposing at least a portion of said semiconductor material.

* * * * *